July 7, 1970 K. E. BEAN ET AL 3,519,901

BI-LAYER INSULATION STRUCTURE INCLUDING POLYCRYSTALLINE SEMICONDUCTOR MATERIAL FOR INTEGRATED CIRCUIT ISOLATION

Filed Jan. 29, 1968 3 Sheets-Sheet 1

KENNETH E. BEAN
BILLY M. MARTIN
INVENTOR

BY James C. Fails
ATTORNEY

July 7, 1970 K. E. BEAN ET AL 3,519,901

BI-LAYER INSULATION STRUCTURE INCLUDING POLYCRYSTALLINE SEMICONDUCTOR MATERIAL FOR INTEGRATED CIRCUIT ISOLATION

Filed Jan. 29, 1968 3 Sheets-Sheet 2

United States Patent Office 3,519,901
Patented July 7, 1970

3,519,901
BI-LAYER INSULATION STRUCTURE INCLUDING POLYCRYSTALLINE SEMICONDUCTOR MATERIAL FOR INTEGRATED CIRCUIT ISOLATION

Kenneth E. Bean, Richardson, and Billy M. Martin, Dallas, Tex., assignors to Texas Instruments Incorporated, Dallas, Tex., a corporation of Delaware
Filed Jan. 29, 1968, Ser. No. 701,460
Int. Cl. H01l *11/00, 15/00*
U.S. Cl. 317—235 13 Claims

ABSTRACT OF THE DISCLOSURE

This specification discloses a method of fabricating an integrated circuit characterized by electronic components being formed in a polycrystalline semiconductor, such as silicon or germanium, deposited at less than 900° C. and at a rate of less than one micron per minute and overlying an isolation layer covering components formed in a base region of monocrystalline semiconductor material. The components in the polycrystalline semiconductor may employ junctions and may be active or passive. More than one layer of polycrystalline semiconductor and more than one isolation layer may be employed.

BACKGROUND OF THE INVENTION

Field of the invention

This invention relates to devices employing semiconductors and their fabrication. More particularly, it relates to multi-level integrated circuits wherein electronic components are formed in more than one level of semiconductors.

Description of the prior art

In fabricating integrated circuits, a large number of electronic components are assembled in a limited space. Many of these electronic components must be high performance active components. Many others of these components may be passive components such as resistors and capacitors; or they may be low performance components, such as field effect transistors, employing one or more junctions between semiconductor material having different types of conductivity. Heretofore all of these electronic components ordinarily have been formed or fabricated into valuable monocrystalline semiconductor material. This fabrication and requisite isolation necessitated large junctions and created a susceptibility to malfunction in the presence of massive radiation dosages. Attempts have been made in the past to form in an economical and practical process, electronic components in second level polycrystalline silicon. Such attempts, however, were frustrated because the polycrystalline silicon did not possess the requisite fine grain structure and required excessive deposition with subsequent lapping and polishing. Not only is the excessive deposition and the lapping and polishing expensive but the steps introduce damage into the structure, require cleaning and thus thwart attempts to produce economical components in the polycrystalline silicon.

Additionally, metal has been employed to form resistors atop an oxide insulating layer over a monocrystalline semiconductor wafer containing components. While useful, the inherent low resistivity of the metal limits this application, particularly in the field of low power devices.

SUMMARY OF THE INVENTION

Accordingly, it is an object of this invention to produce devices containing economical components in polycrystalline semiconductor having characteristics alleviating the necessity for excessive deposition and subsequent lapping and polishing.

It is also an object of this invention to delineate a method of producing integrated circuits by incorporating circuit components into polycrystalline semiconductor formed under conditions innately effecting the desired characteristics, and minimizing susceptibility to malfunctions resulting from massive radiation dosages.

Specifically, it is an object of this invention to form resistors having adjustable resistivities up to 100,000 ohm centimeters per square.

In accordance with the invention, there is provided an integrated circuit device comprising, (a) a semiconductor surface portion of a body having a component formed at a major surface thereof, (b) an isolation film covering the surface and the component, and having an aperture above a selected portion of the component for forming ohmic contact therewith, (c) a layer of polycrystalline semiconductor having grain sizes less than 0.25 micron mean effective diameter uniformly distributed over the isolation film forming a substantially smooth surface, and containing a second level component formed therein, and (d) an ohmic interconnection connecting the component in the semiconductor through the aperture with the second level component in the polycrystalline semiconductor.

In another aspect of the invention, there is provided an improvement in a method of fabricating an integrated circuit having multiple circuit components. The improvement comprises the steps of:

(a) forming a component at a major surface of a semiconductor portion of a body, (b) depositing an isolation film over the component, (c) depositing a semiconductor over the isolation film at a temperature less than 900° C. and at a deposition rate less than 1 micron per minute whereby a fine-grained polycrystalline semiconductor having a substantially smooth surface is deposited over the film, (d) forming a second level component in the polycrystalline semiconductor, (e) forming an aperture through the isolation film, and (f) electrically connecting the second level component via the aperture through the isolation film with the component in the semiconductor.

DESCRIPTION OF SPECIFIC EMBODIMENTS

Figure 1:
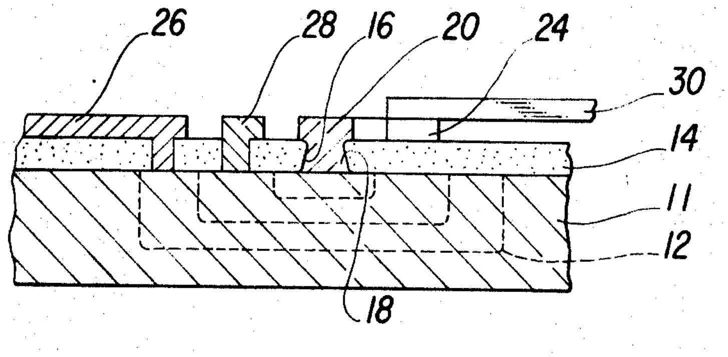
FIG. 1 is a cross sectional view of one embodiment of the invention.

A simple embodiment of the invention is illustrated in FIG. 1. Therein substrate 11 of monocrystalline semiconductor supports component 12 of an electronic circuit. Substrate 11 may be a unitary body or merely a portion of a larger body and may be of any conventional semiconductor such as silicon, germanium or Group III–V compounds like gallium arsenide. Circuit component 12 may be any of the components conventionally employed in a monocrystalline semiconductor. In FIG. 1, a transistor is illustrated as component 12.

Isolation layer 14 is deposited over substrate 11 and component 12. Isolation layer 14 can be deposited by low temperature deposition such as radio frequency sputtering. A particularly suitable process has been found to be the decomposition of silane at temperatures of 300–500° C. Silicon nitride may be deposited by the decomposition of silane in the presence of ammonia in an inert carrier gas such as helium, neon, or argon. Alternatively, silicon oxide can be deposited as the isolation film 14 by the decomposition of silane in the presence of oxygen in the inert carrier gas.

Aperture 16 is formed in isolation layer 14 by conventional photolithographic technique which includes an etching step. In photolithographic technique, a photoresistive material such as Kodak's KMER is emplaced over the oxide mask and selectively exposed to light. A suitable developer-solvent, such as trichlorethylene, finishes development of that portion of the mask exposed to light and dissolves away that portion which has not been exposed to light, leaving an aperture. Thereafter, an etch solution, such as a solution of hydrofluoric acid, is employed to etch aperture 16 in isolation layer 14. The photoresist mask is removed; for example, by physical means or with a suitable removal solvent such as methylene chloride.

The slice is cleaned and placed in a temperature-controlled environment such as a furnace, on a holder, such as a carbon or molybdenum boat. Thereafter a compound is passed into the temperature-controlled environment in a carrier gas and decomposed to deposit semiconductor. For example, silicon may be deposited successfully from the low temperature decomposition of silane ($SiH_4$). Other compounds such as the tetra halides of the semiconductor, e.g., germanium tetrachloride or silicon tetrachloride, may be employed.

We have found that when the temperature is controlled at no more than 900° C. and the deposition rate is controlled at less than one micron per minute ($\mu$/min.), an extremely fine grained polycrystalline silicon is formed which exhibits unusual characteristics bearing a striking similarity to monocrystalline silicon. The polycrystalline silicon which is formed effects a surface which is mirror-like in its finish. There is no appreciable granularity. Detailed studies with electron microscope indicate all grain sizes are less than 0.25 micron in mean effective diameter. Ordinarily, the grain size is less than 0.1 micron in mean effective diameter. Films of polycrystalline silicon having a grain size of approximately a few thousandths of a micron in mean effective diameter have been formed. These films of polycrystalline silicon have been formed over isolation films covering (1) monocrystalline silicon, (2) monocrystalline germanium, and (3) monocrystalline gallium arsenide. Similarly, fine grained polycrystalline germanium is formed at temperatures of less than 900° C. and somewhat lower than the polycrystalline silicon and less than one micron per minute rate of deposition.

The lower temperature which must be employed depends upon the polycrystalline semiconductor to be formed. Specifically, the lower temperature which must be effected is that temperature at which the compound from which the semiconductor is to be formed undergoes decomposition. For example, excellent results are obtained from the decomposition of silane at temperatures of from about 750 to about 900° C. to effect deposition of polycrystalline silicon. On the other hand, polycrystalline germanium may be deposited from the thermal decomposition of germanium tetrachloride at lower temperatures; e. g. below 750° C. and above the decomposition temperature of germanium tetrachloride.

Semiconductor 18 deposited in aperture 16 may be monocrystalline or it may be polycrystalline in character.

In any event as the deposition is continued and is moved away from aperture 16, the semiconductor becomes polycrystalline in character. Deposition is continued until the desired thickness of polycrystalline semiconductor is deposited.

Figure 2:
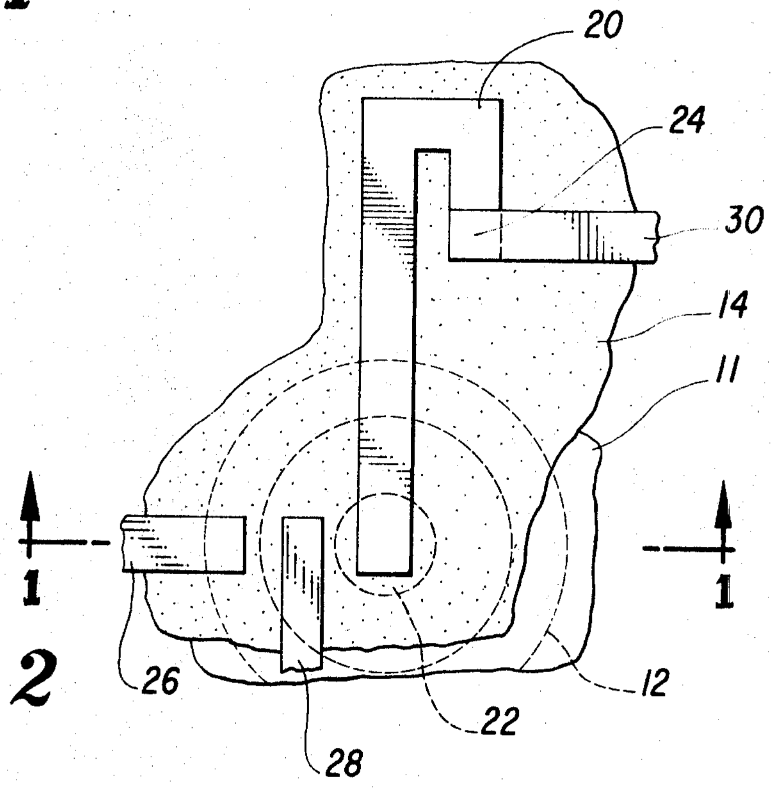
FIG. 2 is a plan view of the embodiment shown in FIG. 1.

After the polycrystalline semiconductor has been formed over the isolation layer 14, conventional photolithographic techniques are again employed to selectively etch and remove the polycrystalline semiconductor except in the desired areas. In FIG. 1, a resistor 20 is formed by the selective removal of the polycrystalline silicon from about the resistor. This is illustrated in FIG. 2 more graphically wherein silicon resistor 20 is shown in plan view atop isolation layer 14. As shown resistor 20 extends from emitter 22 of component 12 to terminal pad 24.

The collector of transistor 12 is connected with another part of a circuit (not shown) through lead 26. Similarly, the base of transistor 12 is connected with another part of the circuit through lead 28. The leads 26 and 28 are formed by first level metallization following deposition of the polycrystalline semiconductor. The electrical connection of leads 26 and 28 with the selected regions of the transistor is made through apertures formed in isolation layer 14. The apertures are formed by conventional photolithographic technique. Metal conductors, such as gold or aluminum, are ordinarily employed for leads 26 and 28.

In rare instances where complex interconnection patterns are to be employed over the isolation layer 14, high melting metal, such as molybdenum, tantalum, or tungsten, may be deposited as the metal conductor over a first isolation layer and covered by a second isolation layer before the polycrystalline semiconductor is deposited thereover.

In any event, the desired electrical connection pattern is effected after first level metallization by employing conventional photolithographic technique to selectively etch away the undesired metal and leave only the desired metal conductors or leads, connecting selected regions.

Regardless of the order in which the leads in the polycrystalline components are formed, we have found that ohmic contacts may be made by bonding metal conductors directly to the polycrystalline semiconductor without the necessity of diffusing dopants thereinto for ohmic contact. For example, lead 30 may be bonded directly to terminal pad 24 of resistor 20. This surprising ability to bond metal leads directly to the polycrystalline semiconductor facilitates making desired lead connections into multilevel components.

Ordinarily, the resistance of the deposited polycrystalline silicon can be controlled by the thickness and width of the portion remaining after selective etching. Additionally, however, the resistivity can be varied by including dopants into the polycrystalline semiconductor. For example, where resistivity of polycrystalline silicon is desired to be decreased; gallium, phosphorous, or boron may be employed as dopants. Doping is readily attainable. In the previous example in which silane is being carried in hydrogen carrier gas, phosphine is added to effect deposition of phosphorous simultaneously with the silicon and reduce the resistivity.

Figure 3:
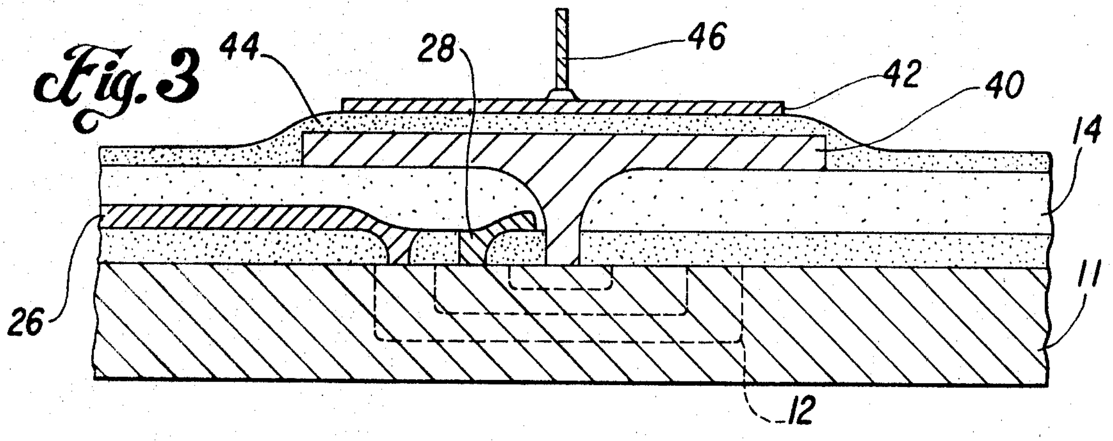
FIG. 3 is a cross sectional view of another embodiment of the invention in which a capacitor is formed in the second level.

FIG. 3 illustrates another embodiment of the invention in which the polycrystalline semiconductor 40 is formed as one plate of a capacitor above isolation layer 14. Similarly as with resistor 20, polycrystalline semiconductor 40 can include dopants. The concentration of dopants included in polycrystalline semiconductor 40 will vary the capacitance of the final capacitor structure.

As the other plate of the capacitor a metal film 42 is deposited atop a layer of dielectric material 44, in turn, atop polycrystalline semiconductor 40. Lead 46 is shown as an externally bonded lead for simplicity. It is to be realized, of course, that capacitor 42 can be connected with another component via conductive leads atop the dielectric layer 44. Dielectric layer 44 may be silicon oxide or silicon nitride. The other component and leads 26 and 28, shown in FIG. 3, are formed of metals having high melting points and between isolation layers as described in connection with FIGS. 1 and 2.

Figure 4:
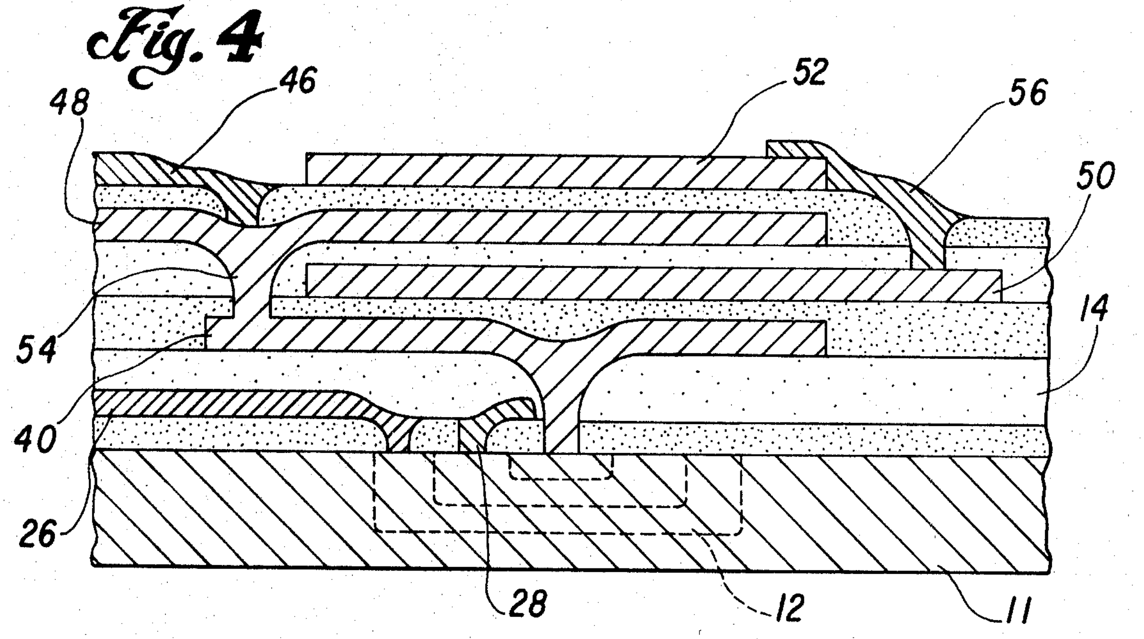
FIG. 4 is a cross sectional view of a similar embodiment in which stacked plates of capacitors are formed in subsequent layers of polycrystalline semiconductor.

Another embodiment of the invention is illustrated in FIG. 4. Therein multiple layers 40 and 48 are stacked alternately with multiple layers 50 and 52 of polycrystalline semiconductor to effect an improved capacitor of greater capacitance per unit surface area in the multilevel device. Alternate plates are interconnected. That is, layers 40 and 48 are connected together through an aperture by polycrystalline silicon 54 which is insulated from plates 50 and 52. Similarly, plates 50 and 52 are interconnected through an aperture by metal conductor 56 deposited through the aperture and connected with plates 50 and 52 but isolated from plates 40 and 48. Conductor 46 is shown as an expanded contact which may float, electrically, or be connected elsewhere in the circuit (not shown). The remainder of the device shown in FIG. 4 is fabricated as described in connection with FIG. 1.

Figure 5:
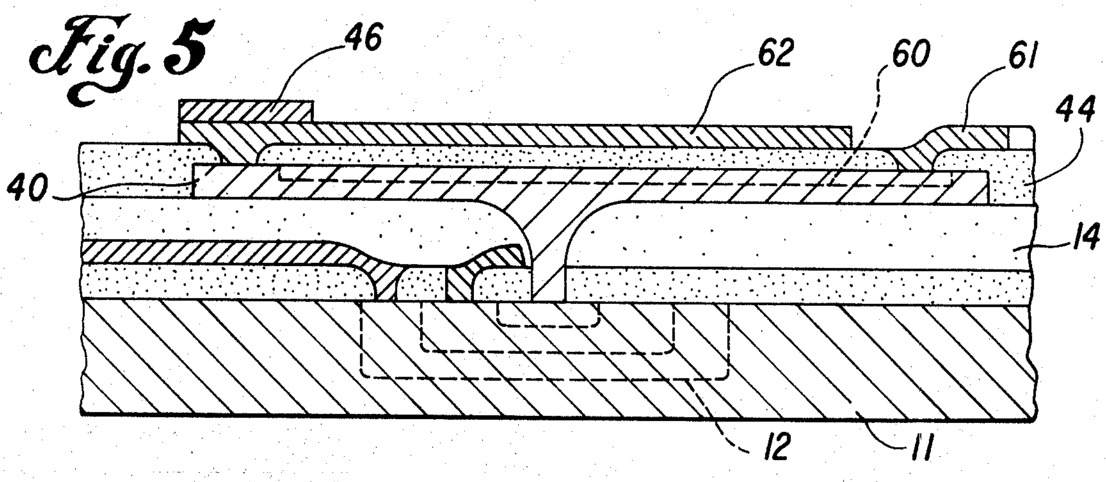
FIG. 5 is a cross sectional view of an embodiment of the invention in which a P-N junction is formed in the layer of polycrystalline semiconductor.

FIG. 5 illustrates another embodiment of the invention. In FIG. 5 the capacitance of second level polycrystalline semiconductor 40 is improved by having formed therein a region 60 having a P- or N-type conductivity, as determined by the dopant. Ordinarily, region 60 is doped to obtain conductivity opposite to layer 40. In this way a junction is formed and a capacitor having an improved quality factor Q is made.

Because the polycrystalline semiconductor formed by the method of our invention is so fine-grained, we have been able to effect P- or N-type conductivity by employing the respective acceptor and donor dopant impurities. For example, to obtain P-type conductivity, acceptor dopant such as boron or gallium are employed; and, conversely, to obtain N-type conductivity donor dopants such as phosphorous, arsenic or antimony are employed. Although the dopant impurities may be deposited simultaneously with the semiconductor as described in connection with altering resistivity, this method is ordinarily employed only to effect N-type conductivity. Specifically, a compound, such as phosphine, arsine, or antimony pentachloride, is introduced into hydrogen carrier gas and thermally decomposed to effect deposition of the donor dopant impurity and effect N-type conductivity. A similar method, in which diborane or gallium trichloride is incorporated in hydrogen carrier gas and thermally decomposed to effect simultaneous deposition of acceptor dopant impurities with polycrystalline semiconductor, may be employed to effect P-type conductivity. Ordinarily, however, the region of P-type conductivity is effected by diffusion. In diffusion, first, a compound such as boron tribromide in an inert carrier gas, such as nitrogen containing a minor amount of oxygen, is thermally decomposed in a temperature-controlled environment to effect deposition of a boron glaze. Second, from the boron glaze, the dopant boron is diffused into the polycrystalline semiconductor, converting N-type conductivity to P-type conductivity wherever the polycrystalline semiconductor is exposed.

Referring back to FIG. 5, a layer of dielectric material 44 is deposited over polycrystalline semiconductor 40 and over oppositely doped region 60. Atop the dielectric 44 a second plate 62 of metal is formed to complete the capacitor. In this way a capacitor having improved Q and increased capacitance per unit of surface area is formed. Conductors 46 and 61 are illustrated as contacts for simplicity.

Figure 6:
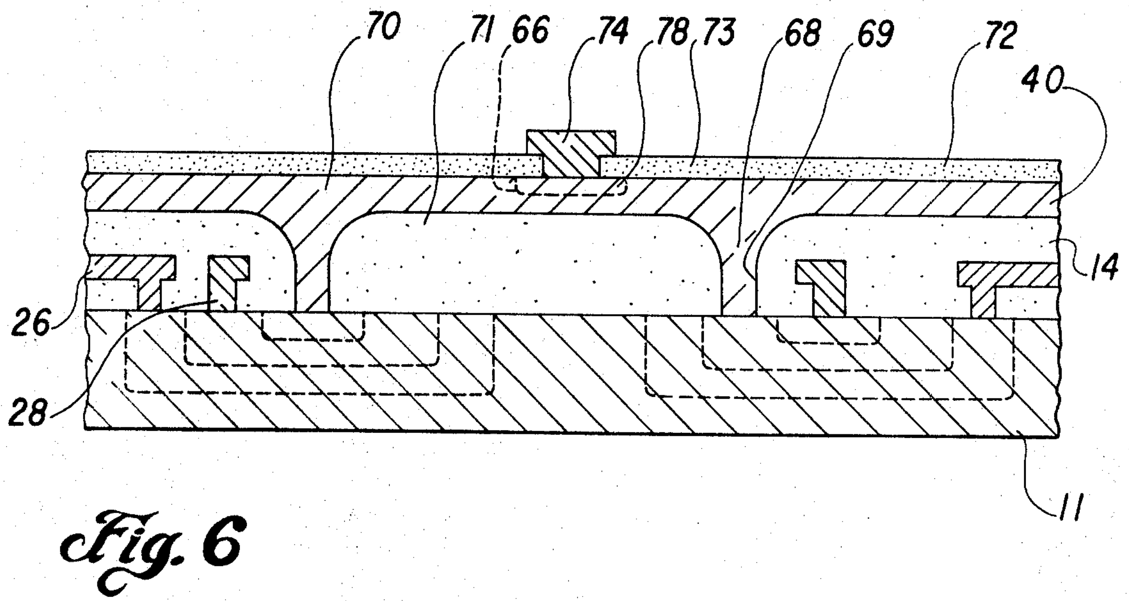
FIG. 6 is a cross sectional view of still another embodiment of the invention in which a P-N junction is formed and is employed as a gate in a field effect transistor in the layer of polycrystalline semiconductor.

FIG. 6 illustrates still another embodiment of the invention. In FIG. 6, the polycrystalline semiconductor 40 has formed therein a P-N or N-P junction 66 through selective use of acceptor and donor dopants as noted hereinbefore. Semiconductors 68 and 70 deposited through apertures 69 and 71 in isolation film 14 as described hereinbefore, serve as source and drain, respectively, for a field effect transistor; or, conversely, as bases for a unijunction transistor.

An insulating film 72 is formed over the polycrystalline semiconductor, and an aperture 73 selectively etched therethrough by use of polycrystalline techniques. Through aperture 73 in insulating film 72, metal conductor 74 is deposited to form ohmic contact with region 78 within junction 66. Conductor 74 is connected with another portion of the circuit (not shown) and operates to reverse bias junction 66 and act as a gate in a field effect transistor to controllably choke the channel between source and drain 68 and 70 and regulate flow of current therebetween. Conversely, conductor 74 can be employed as the emitter of a unijunction transistor to alternately bias junction 66 in forward and reverse directions and effect switching on and off of current between bases 68 and 70 if desired.

Other components can be formed in the polycrystalline semiconductor without depositing an excess of the semiconductor material and subsequently lapping, polishing and cleaning the wafers. The fine-grained polycrystalline semiconductor we have formed not only has grain sizes of a mean effective diameter of less than 0.25 micron, but also has no grains larger than about one-half micron in diameter. This restricted maximum size is believed important in effecting our adventageous results. Employing the method of the invention, we have formed second and subsequent layers of fine-grained polycrystalline silicon; employing deposition temperatures of 800–885° C. and deposition rates of 0.25–0.75 micron per minute; of resistivities of 1,000; 5,000; 10,000 and 100,000 ohms per square. We have formed up to 10,000 angstroms thickness of the polycrystalline silicon over isolating layers of from 2000 angstroms of silicon nitride to 40,000 angstroms of silicon dioxide. We have formed devices employing junctions formed in the polycrystalline silicon. The polycrystalline silicon has been effective over silicon, germanium, and gallium arsenide devices.

The method of the invention may be employed to increase the packing density of semiconductor components per unit of surface area. Furthermore, when resistors are formed of polycrystalline semiconductor in a second level instead of in first level monocrystalline semiconductor, the resulting devices are radiation hardened and more resistant to ill effects from massive radiation.

Although the invention has been described with a high degree of particularity, it is understood that the present disclosure has been made only by way of example and that numerous changes in the details of construction and the combination and arrangement of parts may be resorted to without departing from the spirit and scope of the invention as hereinafter claimed.

What is claimed is:

1. An integrated circuit device comprising:

(a) a semiconductor surface portion of a body containing a component formed therein, (b) an isolation film covering said surface portion and said component and having an aperture above a selected portion of said component for forming ohmic contact therewith, (c) a layer of polycrystalline semiconductor having grain sizes less than 0.25 micron mean effective diameter uniformly distributed over said isolation film effecting a substantially smooth surface, and containing a second level component formed therein, and (d) an ohmic interconnection connecting said component through said aperture and connected with said second level component in said polycrystalline semiconductor.

2. The integrated circuit device of claim 1 in which said ohmic interconnection is semiconductor deposited in said aperture.

3. The device of claim 2 wherein said semiconductor is either silicon or germanium.

4. The device of claim 3 wherein said semiconductor is silicon.

5. The device of claim 3 wherein said semiconductor material is germanium.

6. The device of claim 1 wherein said second level component contains a junction between regions of opposite conductivity types.

7. The device of claim 6 wherein said second level component is a capacitor employing said junction to improve the performance factor Q of said capacitor.

8. The device of claim 6 wherein said second level component is a field effect transistor.

9. The device of claim 6 wherein said second level component is a unijunction transistor.

10. The device of claim 1 wherein said second level component is a passive component.

11. The device of claim 10 wherein said passive component is a resistor of polycrystalline semiconductor having ohmic contacts at each end thereof.

12. The device of claim 10 wherein said second level component is a capacitor of one plate of polycrystalline semiconductor material, a layer of dielectric material covering said polycrystalline semiconductor material and a second plate overlying said layer of dielectric material.

13. The device of claim 10 wherein said capacitor comprises more than one layer of dielectric material and more than one layer of polycrystalline semiconductor material alternately stacked together and means interconnecting alternate layers of said polycrystalline semiconductor material to effect the desired capacitance.

References Cited

UNITED STATES PATENTS

| | | | |
|---|---|---|---|
| 3,323,198 | 6/1967 | Shortes | 29—155.5 |
| 3,366,519 | 1/1968 | Pritchard et al. | 156—3 |

JOHN W. HUCKERT, Primary Examiner

A. J. JAMES, Assistant Examiner

U.S. Cl. X.R.

29—155.5; 148—174; 317—234